United States Patent
Hsieh et al.

(10) Patent No.: US 12,106,964 B2
(45) Date of Patent: Oct. 1, 2024

(54) DOUBLE-PATTERNING METHOD TO IMPROVE SIDEWALL UNIFORMITY

(71) Applicant: Winbond Electronics Corp., Taichung (TW)

(72) Inventors: Chu-Chun Hsieh, Taichung (TW); Ting-Wei Wu, Taichung (TW); Chih-Jung Ni, Taichung (TW)

(73) Assignee: Winbond Electronics Corp., Taichung (TW)

( * ) Notice: Subject to any disclaimer, the term of this patent is extended or adjusted under 35 U.S.C. 154(b) by 159 days.

(21) Appl. No.: 17/326,334

(22) Filed: May 21, 2021

(65) Prior Publication Data

US 2021/0391174 A1    Dec. 16, 2021

(30) Foreign Application Priority Data

Jun. 16, 2020   (TW) .................................. 109120246

(51) Int. Cl.
*H01L 21/033*   (2006.01)
(52) U.S. Cl.
CPC ...... *H01L 21/0338* (2013.01); *H01L 21/0332* (2013.01); *H01L 21/0335* (2013.01); *H01L 21/0337* (2013.01)
(58) Field of Classification Search
CPC ............. H01L 21/0338; H01L 21/0332; H01L 21/0335; H01L 21/0337; H01L 21/3086; H01L 21/32139
See application file for complete search history.

(56) References Cited

U.S. PATENT DOCUMENTS

| 6,049,102 A * | 4/2000 | Yamate | H10B 12/01 |
| | | | 257/296 |
| 2005/0085037 A1* | 4/2005 | Kleint | H10B 69/00 |
| | | | 257/E21.679 |
| 2005/0202618 A1* | 9/2005 | Yagishita | H01L 21/84 |
| | | | 257/E21.438 |

(Continued)

FOREIGN PATENT DOCUMENTS

| CN | 103681234 | 3/2014 |
| CN | 104241099 | 12/2014 |
| CN | 103715080 | 8/2016 |

OTHER PUBLICATIONS

"Office Action of Taiwan Counterpart Application", issued on Feb. 19, 2021, p. 1-p. 5.

*Primary Examiner* — Kimberly N Rizkallah
*Assistant Examiner* — Zhijun Xu
(74) *Attorney, Agent, or Firm* — JCIPRNET

(57) ABSTRACT

Provided is a patterning method including following steps. A doped polysilicon layer, a core layer, and an undoped polysilicon layer are sequentially formed on a target layer. The undoped polysilicon layer is patterned to form a polysilicon pattern. A first etching process is performed by using the polysilicon pattern as a mask to remove a portion of the core layer to form a core pattern. A second etching process is performed to remove the polysilicon pattern. An atomic layer deposition (ALD) process is performed to form a spacer material on the core pattern and the doped polysilicon layer. A portion of the spacer material is removed to form a spacer on a sidewall of the core pattern. A portion of the core pattern and an underlying doped polysilicon are removed.

8 Claims, 14 Drawing Sheets

(56) References Cited

U.S. PATENT DOCUMENTS

| | | | |
|---|---|---|---|
| 2008/0017992 A1* | 1/2008 | Kito | H10B 99/00 |
| | | | 257/773 |
| 2010/0055914 A1* | 3/2010 | Min | H01L 21/0337 |
| | | | 438/700 |
| 2011/0104894 A1* | 5/2011 | Kim | H01L 29/66666 |
| | | | 257/E21.294 |
| 2012/0153374 A1* | 6/2012 | Inaba | H01L 21/76232 |
| | | | 438/257 |
| 2012/0238097 A1* | 9/2012 | Huang | B82Y 30/00 |
| | | | 438/694 |
| 2020/0127006 A1* | 4/2020 | Otsu | H10B 43/10 |

* cited by examiner

DOUBLE-PATTERNING METHOD TO IMPROVE SIDEWALL UNIFORMITY

CROSS-REFERENCE TO RELATED APPLICATION

This application claims the priority benefit of Taiwan application serial no. 109120246, filed on Jun. 16, 2020. The entirety of the above-mentioned patent application is hereby incorporated by reference herein and made a part of this specification.

BACKGROUND OF THE INVENTION

Field of the Invention

The present invention relates to a patterning method.

Description of Related Art

With the progress of science and technology, all kinds of electronic products tend to be light, thin, and small. In this trend, a critical size of the semiconductor device has also been gradually reduced, which has made the lithography process more and more difficult. In a conventional lithography process, the method of shrinking the critical size includes using greater numerical aperture (NA) optics, shorter exposure wavelengths (e.g., EUV), or interfacial media other than air (e.g., water immersion). As the resolution of the conventional lithography process has approached theoretical limits, manufacturers have started to turn to double-patterning (DP) methods to overcome optical limitations, thereby increasing the integration density of the semiconductor device.

However, in the current double-patterning method, the morphology of the spacer on the sidewall of the core pattern has poor roughness. Therefore, there are some challenges still to face in the current double-patterning method.

SUMMARY OF THE INVENTION

The invention provides a patterning method, which is able to improve the roughness of the spacer on the sidewall of the core pattern, so that the subsequently formed target pattern has a better sidewall uniformity.

The invention provides a patterning method including: sequentially forming a doped polysilicon layer, a core layer, and an undoped polysilicon layer on a target layer; patterning the undoped polysilicon layer to form a polysilicon pattern; performing a first etching process by using the polysilicon pattern as a mask to remove a portion of the core layer, so as to form a core pattern; performing a second etching process to remove the polysilicon pattern; performing an atomic layer deposition (ALD) process to form a spacer material on the core pattern and the doped polysilicon layer; removing a portion of the spacer material to form a spacer on a sidewall of the core pattern; and removing a portion of the core pattern and an underlying doped polysilicon.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
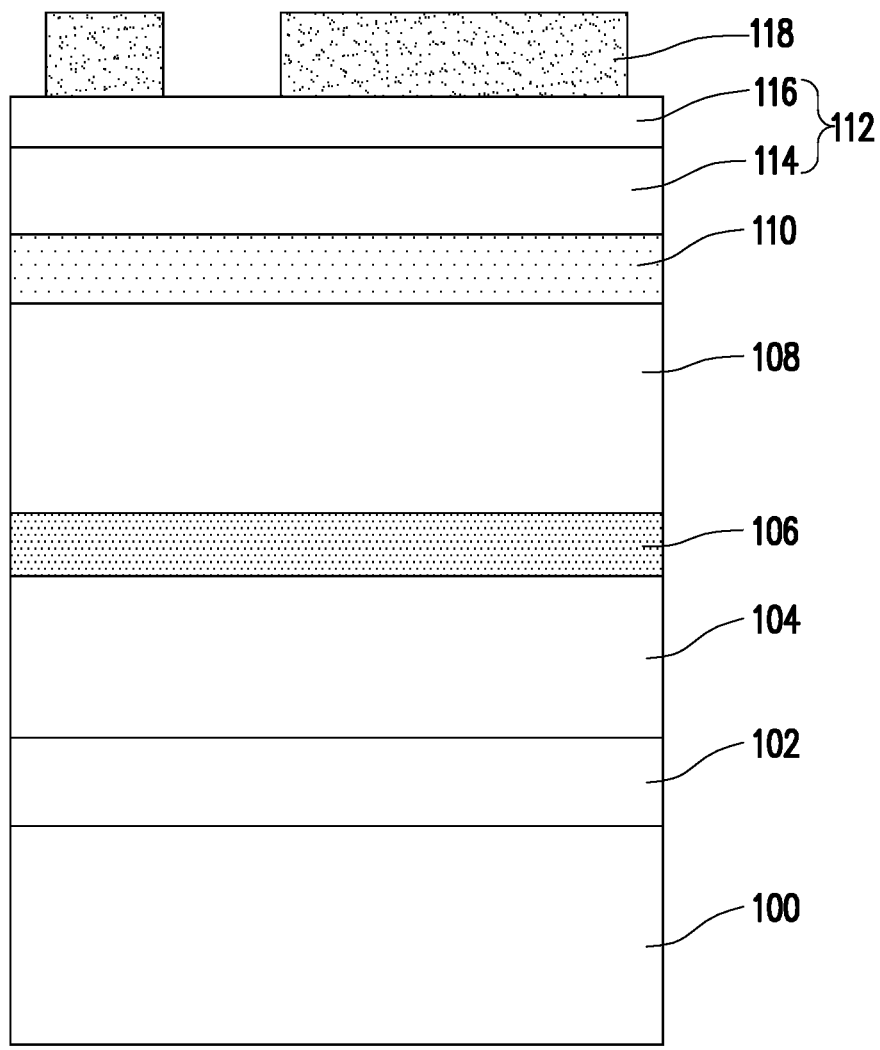
FIG. 1A to FIG. 1N are schematic cross-sectional views of a manufacturing process of a semiconductor structure according to an embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. Wherever possible, the same or similar reference numbers are used in the drawings and the description to refer to the same or similar components, and are not repeated again in the following paragraphs.

Figure 1B:
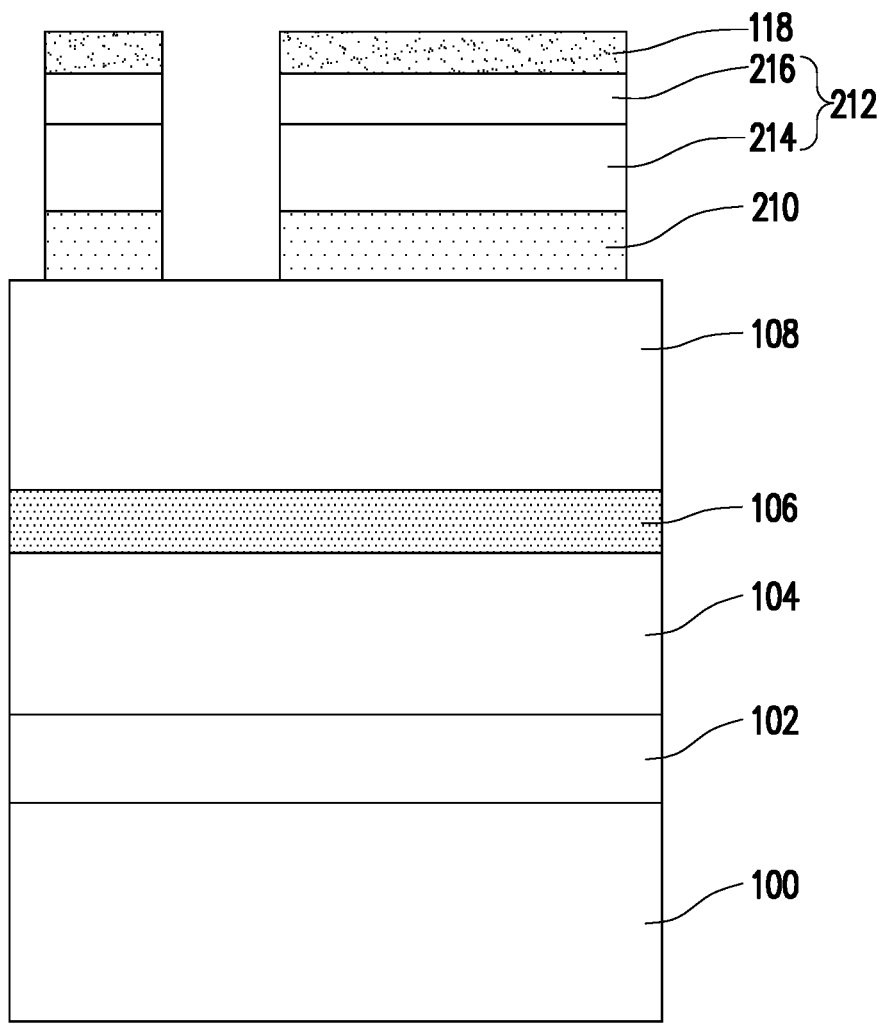
Figure 1C:
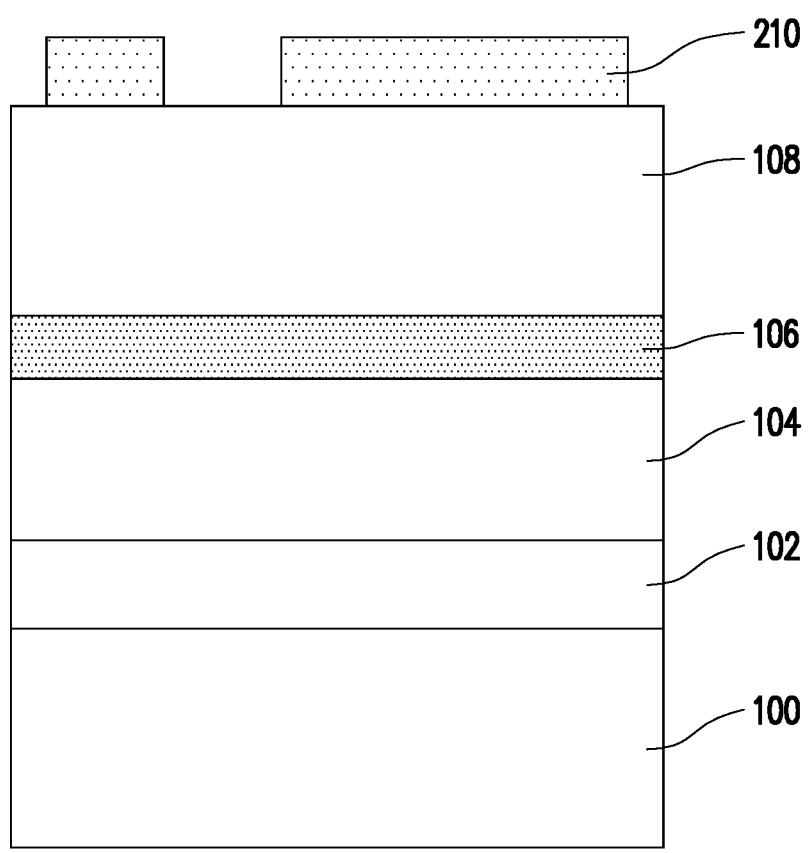
Figure 1D:
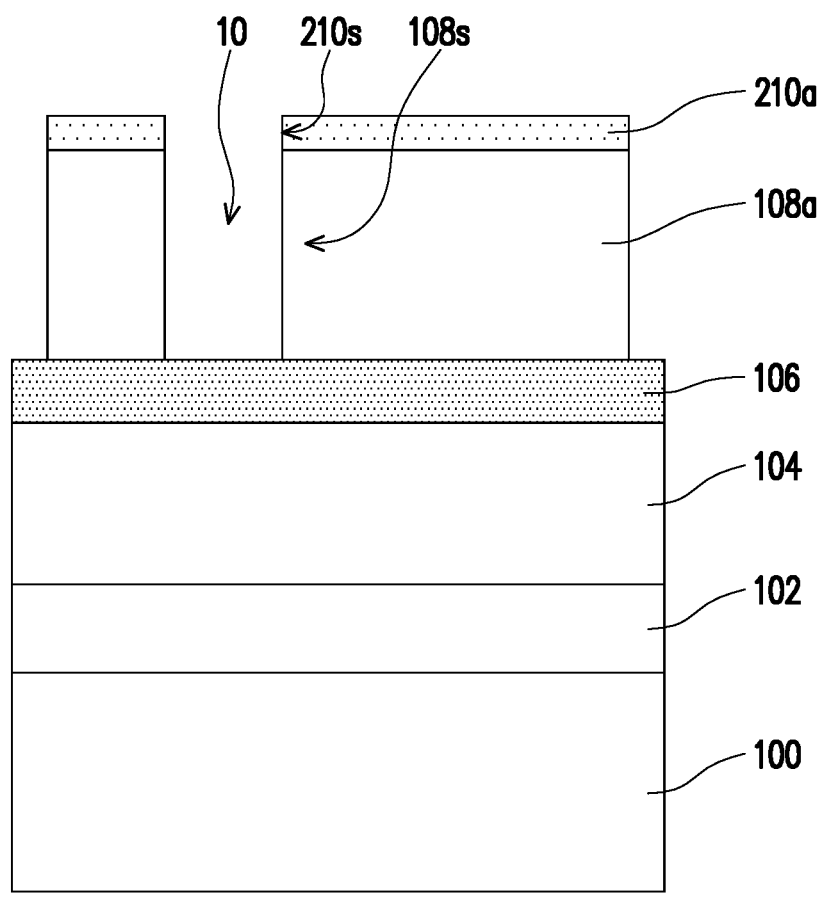
Figure 1E:
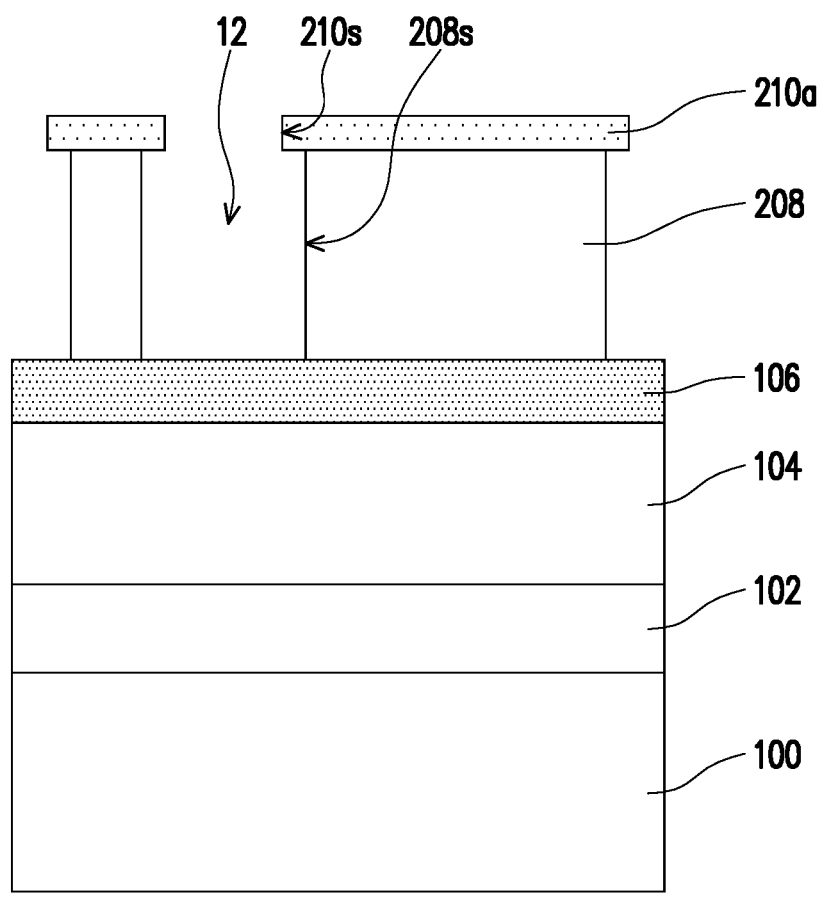
Figure 1F:
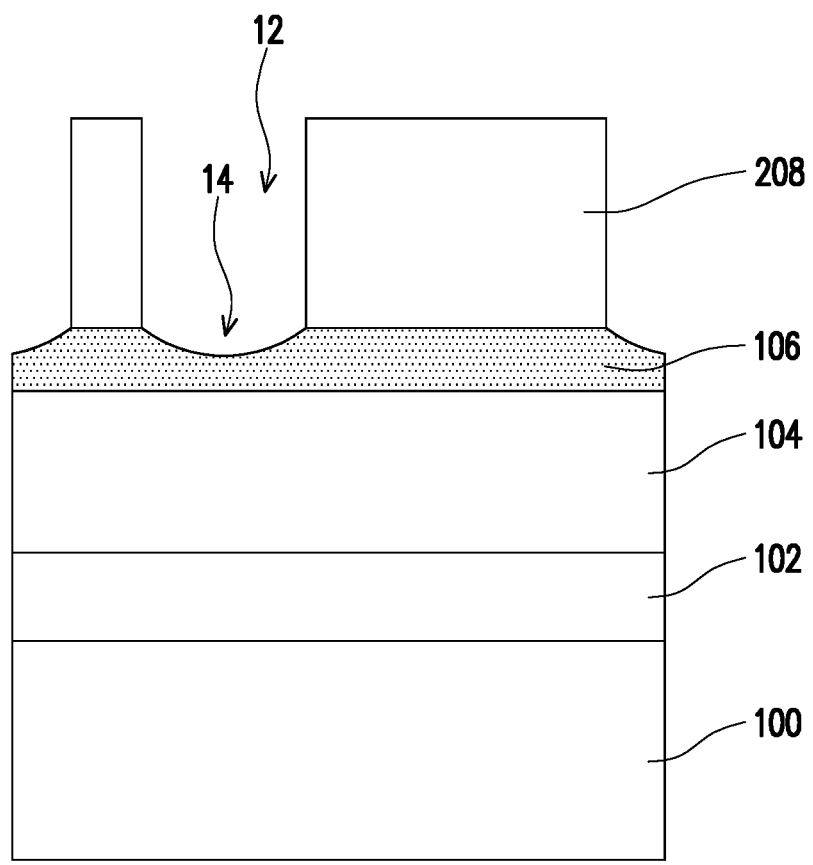
Figure 1G:
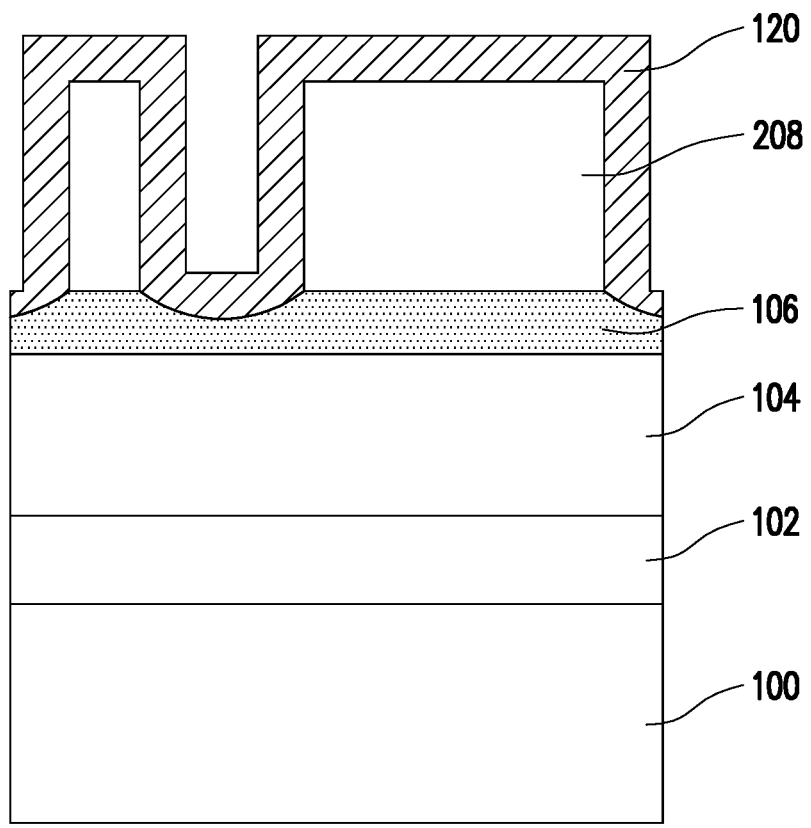
Figure 1H:
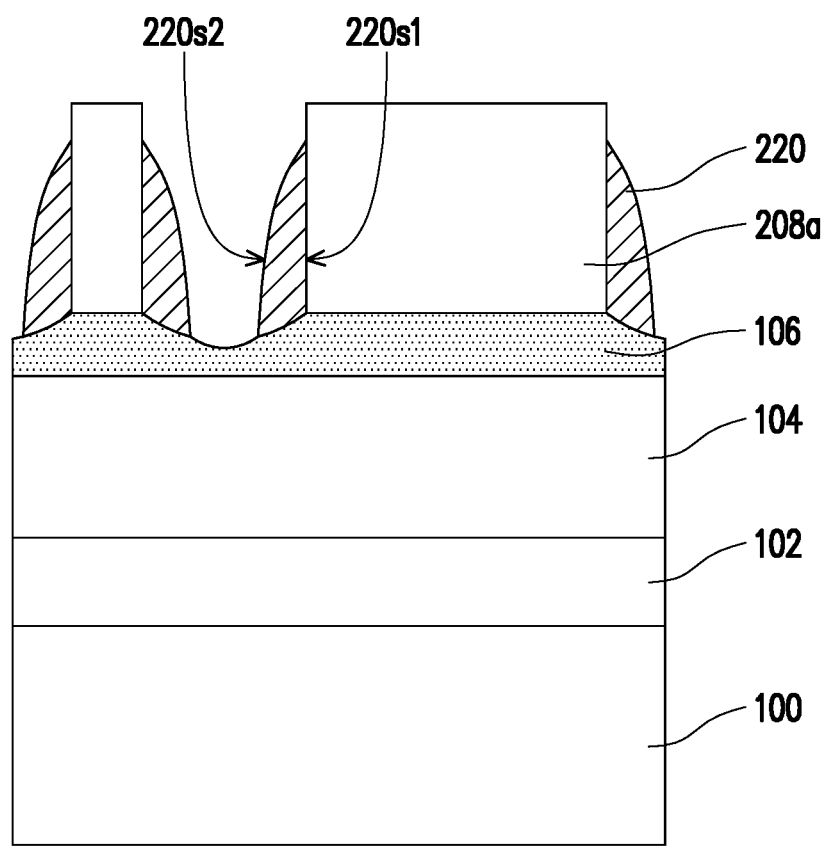
Figure 1I:
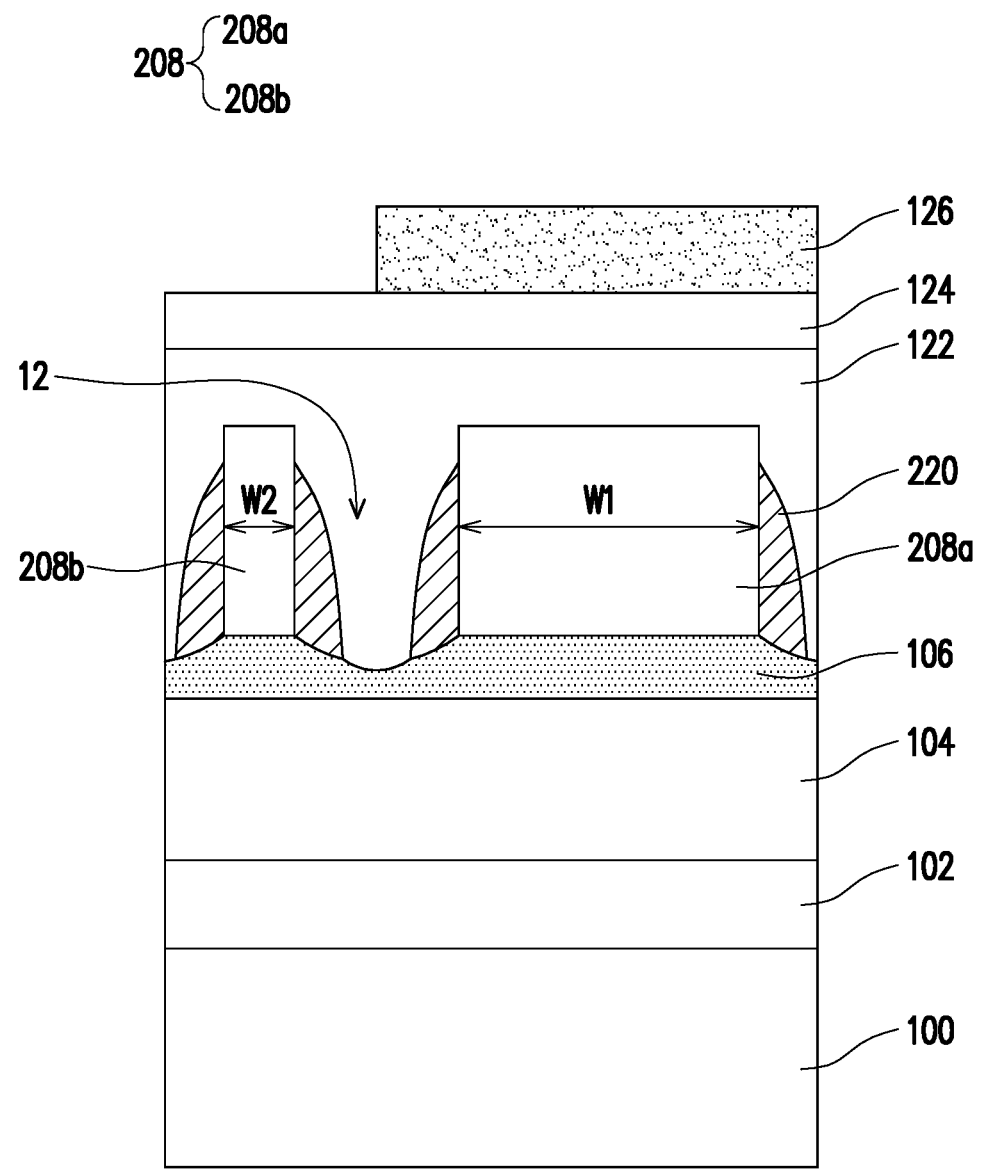
Figure 1J:
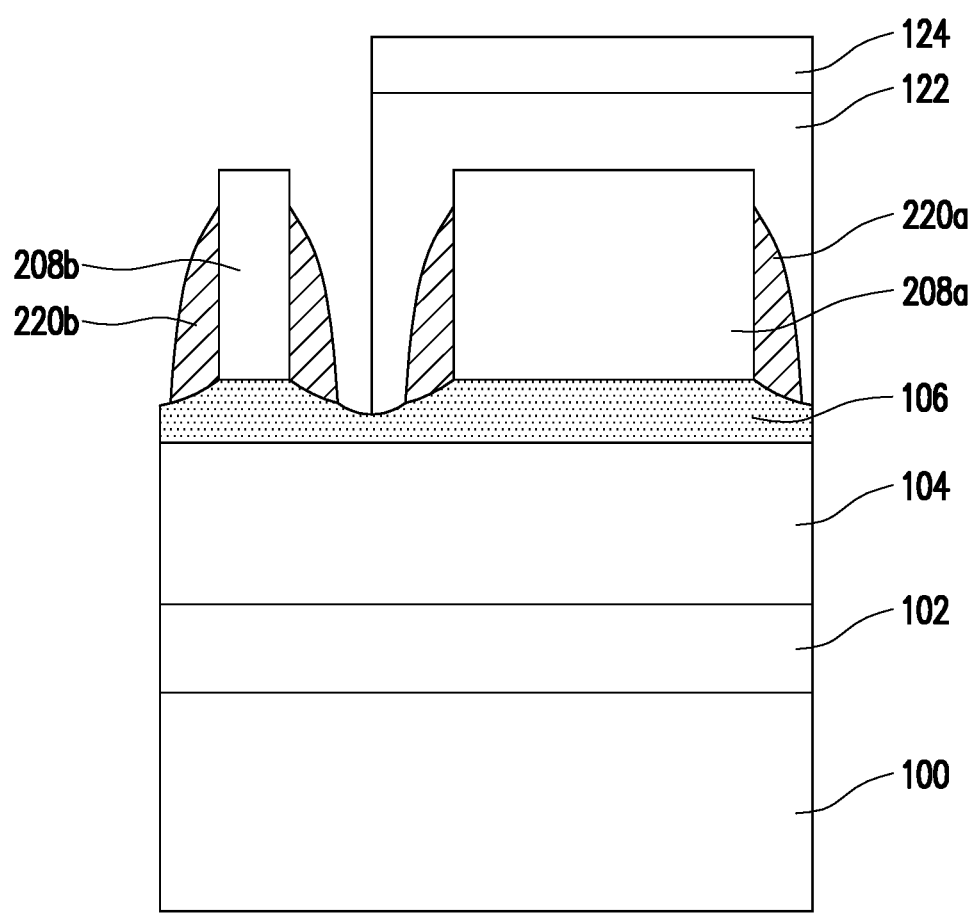
Figure 1K:
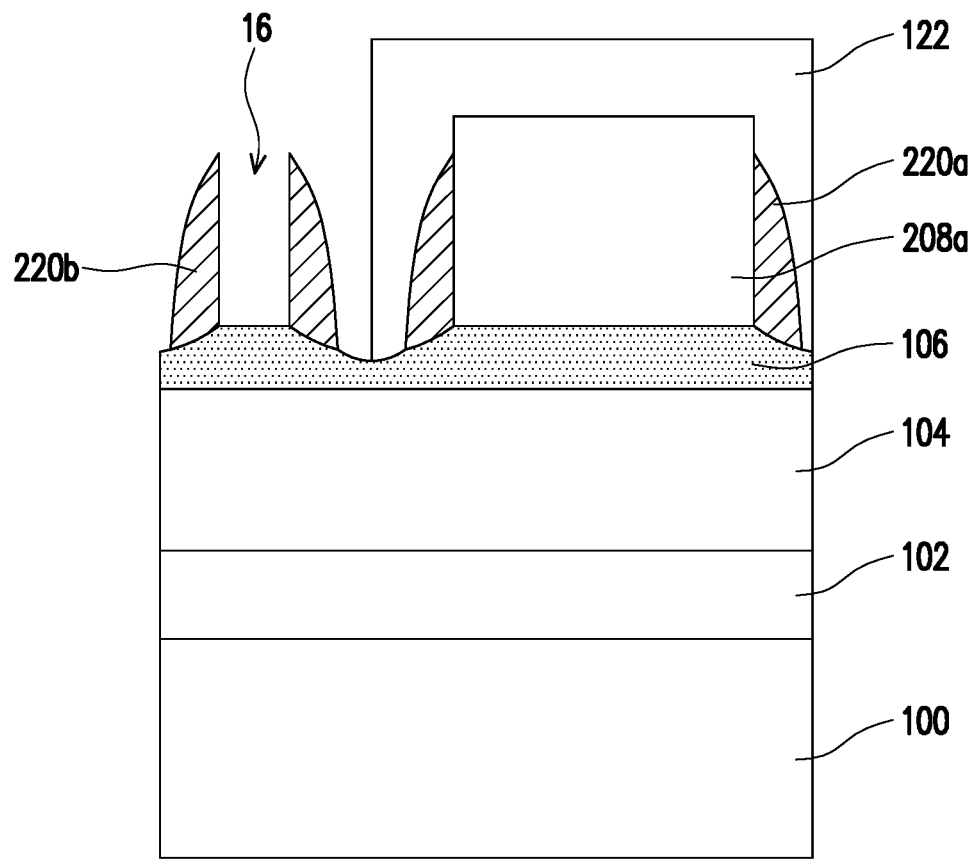
Figure 1L:
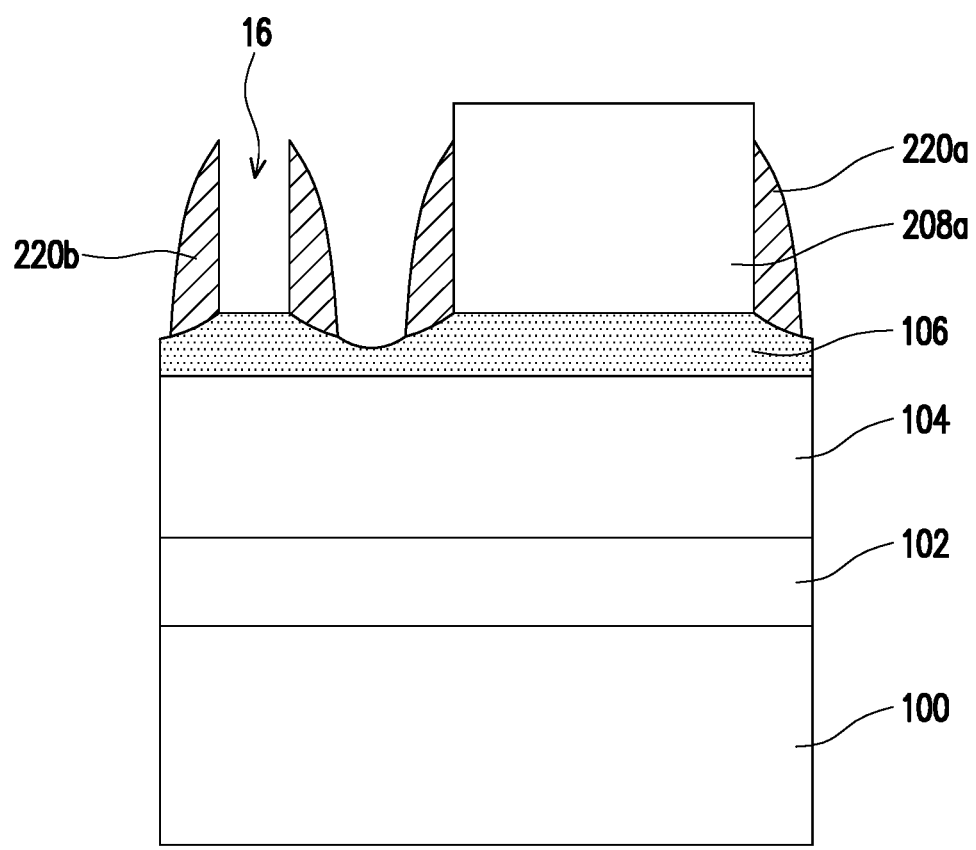
Figure 1M:
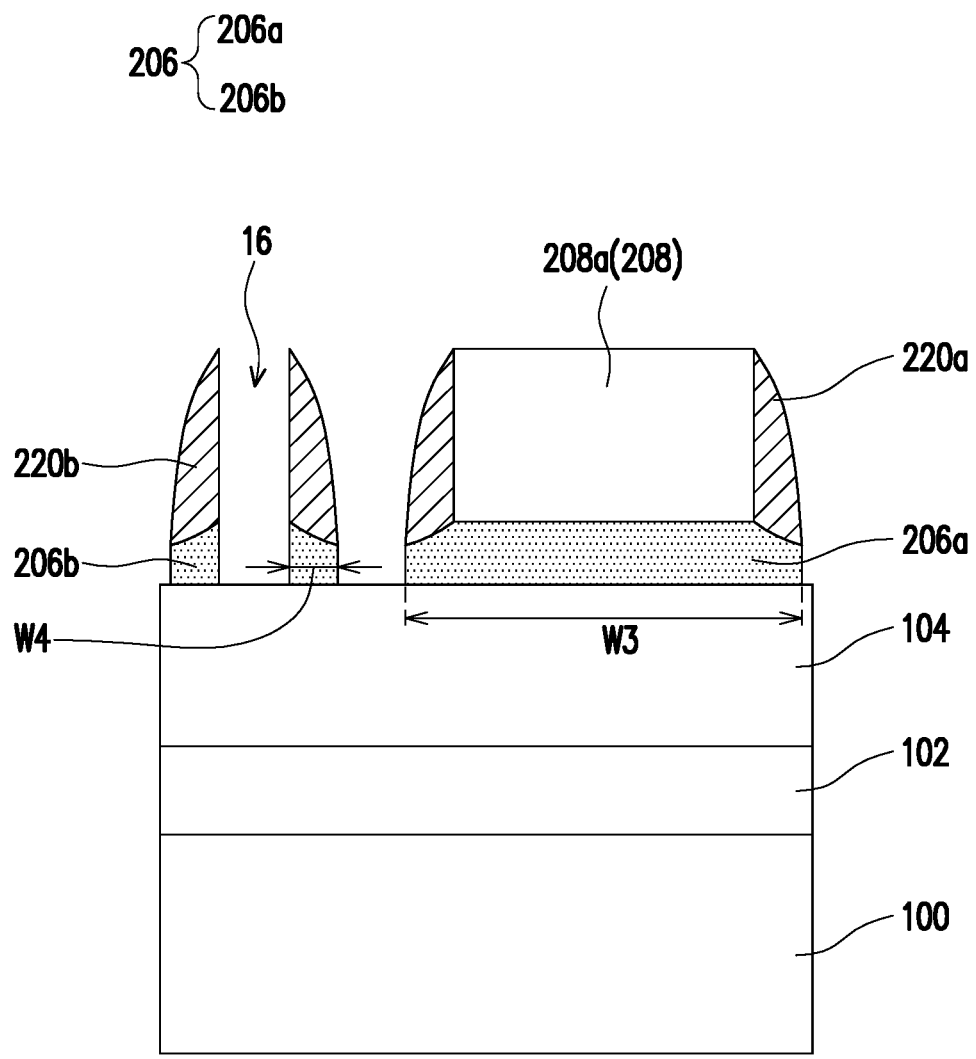
Figure 1N:
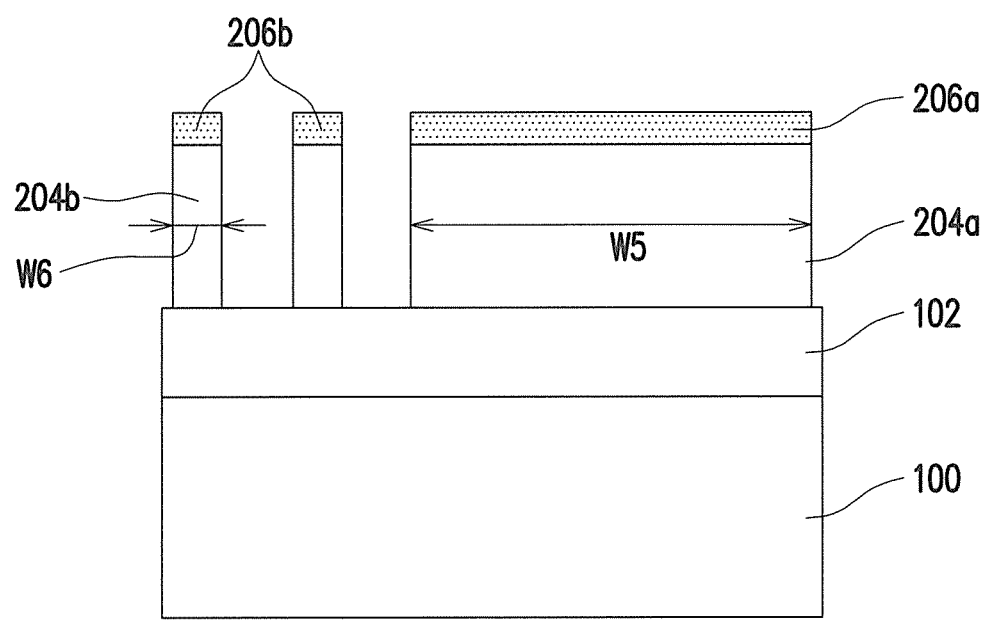

FIG. 1A to FIG. 1N are schematic cross-sectional views of a manufacturing process of a semiconductor structure according to an embodiment of the invention. The semiconductor structure may be a control gate (CG) of a memory, but the invention is not limited thereto. In other embodiments, the semiconductor structure may be a contact of the memory, an active area of a dynamic random access memory (DRAM), an interconnect structure of a logic device, or a combination thereof.

Referring to FIG. 1A, the present embodiment provides a method for manufacturing a semiconductor structure including following steps. First, a target layer 100 is provided. In some embodiments, the target layer 100 may be a polysilicon layer, which may be used as a control gate of the memory. However, the present invention is not limited thereto, in other embodiments, the target layer 100 may also be a metal layer (e.g., a tungsten layer), a silicon substrate, a dielectric layer, or a combination thereof.

Next, a nitride layer 102, an oxide layer 104, a doped polysilicon layer 106, a core layer 108, an undoped polysilicon layer 110, a hard mask layer 112, and a photoresist pattern 118 are sequentially formed on the target layer 100. In an embodiment, the nitride layer 102 may be silicon nitride, and have a thickness of 1 nm to 1000 nm. The oxide layer 104 may be a plasma-enhanced tetraethoxysilane (PE-TEOS) layer, and have a thickness of 1 nm to 1000 nm. The doped polysilicon layer 106 may be formed by using a dopant to perform an ion implantation process, and have a thickness of 1 nm to 1000 nm. In the embodiment, the dopant may be an N-type and/or P-type dopant, such as $BF^{2+}$, $B^+$, $F^+$, $P^+$, or a combination thereof. The core layer 108 may be a low-pressure tetraethoxysilane (LPTEOS) layer, any silicon oxide, or a combination thereof, and has a thickness of 1 nm to 1000 nm. The undoped polysilicon layer 110 may be an intrinsic polysilicon layer, and has a thickness of 1 nm to 1000 nm. The hard mask layer 112 may include a carbide layer 114 and an antireflection layer 116 on the carbide layer 114. A material of carbide layer 114 includes spin-on-carbon (SoC); and a material of the antireflection layer 116 includes silicon oxynitride. The thickness of the hard mask layer 112 is 1 nm to 1000 nm. The photoresist pattern 118 may include a positive type photoresist or a negative type photoresist, and has a thickness of 1 nm to 1000 nm.

It should be noted that, in the present embodiment, the doped polysilicon layer 106 and the undoped polysilicon layer 110 have different doping concentrations. Specifically, the doping concentration of the doped polysilicon layer 106 may be greater than the doping concentration of the undoped polysilicon layer 110. Therefore, in the present embodiment, the etching selectivity between the doped polysilicon layer 106 and the undoped polysilicon layer 110 in the subsequent second etching process may be enlarged or increased, so as to avoid the underlying doped polysilicon layer 106 being removed. For details, please refer to the following paragraphs.

Referring to FIG. 1B and FIG. 1C, by using the photoresist pattern 118 as a mask, the hard mask layer 112 and the undoped polysilicon layer 110 are patterned to form a polysilicon pattern 210 and a hard mask pattern 212 (which includes a carbide pattern 214 and an antireflection pattern 216). In one embodiment, the core layer 108 may be regarded as an etching stop layer in the said patterning process. In the case, a top surface of the core layer 108 is exposed to the polysilicon pattern 210 and the hard mask pattern 212. The photoresist pattern 118 and the hard mask pattern 212 are then removed.

Referring to FIG. 1C and FIG. 1E, by using the polysilicon pattern 210 as a mask, a first etching process is performed to remove a portion of the core layer 108, so as to form a core pattern 208. Specifically, the first etching process includes performing a dry etching step to form an opening 10 in the core layer 108a. In the case, as shown in FIG. 1D, a sidewall 108s of the core layer 108a is flush with a sidewall 210s of the polysilicon pattern 210a. The first etching process further includes performing a wet etching step to trim the core layer 108a, so that a sidewall 208s of the core pattern 208 is concave from the sidewall 210s of the polysilicon pattern 210. From another perspective, the opening 10 is enlarged to an opening 12, so that a width of the core pattern 208 is smaller than a width of the core layer 108a. In one embodiment, the doped polysilicon layer 106 may be regarded as an etching stop layer in the said first etching process. In other words, in the above-mentioned first etching process, most of the core layer 108 is removed, and the doped polysilicon layer 106 is not removed or only a small amount is removed.

Referring to FIG. 1E and FIG. 1F, a second etching process is performed to remove the polysilicon pattern 210a. In an embodiment, the second etching process may be a wet etching process, which includes using an etchant with ammonium hydroxide ($NH_4OH$), tetramethylazanium hydroxide (TMAH), or a combination thereof. In the above-mentioned second etching process, an etching rate of the polysilicon pattern 210a is greater than an etching rate of the doped polysilicon layer 106. That is, in the above-mentioned second etching process, the polysilicon pattern 210a is completely removed, and the doped polysilicon layer 106 is not removed or only a small amount is removed. As shown in FIG. 1F, the opening 12 may be extended downward to form a recess 14 on the doped polysilicon layer 106. However, the present invention is not limited thereto, in other embodiments, the top surface of the doped polysilicon layer 106 exposed to the opening 12 may also be a flat surface. In the present embodiment, in the above-mentioned second etching process, an etching selectivity between the doped polysilicon layer 106 and the polysilicon pattern 210a is about 15 to 100, to ensure the polysilicon pattern 210a is completely removed, and the doped polysilicon layer 106 remains and covers the underlying oxide layer 104.

Referring to FIG. 1G, an atomic layer deposition (ALD) process is performed to form a spacer material 120 on the core pattern 208 and the doped polysilicon layer 106. The spacer material 120 conformally covers the surface of the core pattern 208 and the surface of the doped polysilicon layer 106. In the embodiment, the spacer material 120 may be a dielectric material, such as ALD silicon nitride, any silicon nitride, or a combination thereof. The ALD silicon nitride not only has better step coverage but also has better surface uniformity. Specifically, in the present embodiment, the surface roughness of the spacer material 120 may be less than 3 nm. The said surface roughness may be regarded as the height difference between the highest point and the lowest point of the surface of the spacer material 120. In some embodiments, the spacer material 120 may have a uniform thickness, which is 1 nm to 100 nm.

Referring to FIG. 1G and FIG. 1H, a portion of the spacer material 120 is removed to form a spacer 220 on the sidewall of the core pattern 208. Specifically, the spacer material 120 on the top surface of the core pattern 208 and the top surface of the doped polysilicon layer 106 may be removed by an anisotropic etching process. In one embodiment, the spacer 220 includes a first sidewall 220s1 and a second sidewall 220s2 opposite to each other. The first sidewall 220s1 is in contact with the sidewall of the core pattern 208 and is perpendicular to the bottom surface of the core pattern 208. The second sidewall 220s2 is away from the sidewall of the core pattern 208 and is inclined with respect to the bottom surface of the core pattern 208. In the embodiment, the inclined second sidewall 220s2 may be a curved surface.

Referring to FIG. 1I, a dielectric layer 122, a mask layer 124, and a photoresist pattern 126 are sequentially formed on the core pattern 208. In one embodiment, the dielectric layer 122 may be a spin-on-carbon (SoC) layer, which is filled into the opening 12 and extends to cover the top surface of the core pattern 208. The mask layer 124 may be a spin on silicon anti-reflective coating (SOSA) with a thickness of 1 nm to 100 nm. The photoresist pattern 126 may include a positive photoresist or a negative photoresist, and have a thickness of 1 nm to 1000 nm.

It should be noted that, in the present embodiment, the photoresist pattern 126 covers a first portion 208a of the core pattern 208, while does not cover a second portion 208b of the core pattern 208. The sidewall of the photoresist pattern 126 may correspond to the opening 12. As shown in FIG. 1I, a width W1 of the first portion 208a may be greater than a width W2 of the second portion 208b. In one embodiment, a ratio of the width W1 to the width W2 is 1 to 10000.

Referring to FIG. 1I and FIG. 1J, by using the photoresist pattern 126 as a mask, a portion of the mask layer 124 and a portion of the dielectric layer 122 are removed to expose the second portion 208b and a spacer 220b on the sidewall of the second portion 208b. In the case, as shown in FIG. 1J, the photoresist pattern 126 is also removed.

Referring to FIG. 1J and FIG. 1K, the second portion 208b of the core pattern 208 is removed to form an opening 16 between the spacers 220b. The opening 16 exposes the top surface of the doped polysilicon layer 106. In the case, as shown in FIG. 1K, the mask layer 124 is also removed, while the first portion 208a and the spacer 220a are still covered by the dielectric layer 122.

Referring to FIG. 1K and FIG. 1L, the dielectric layer 122 covering the first portion 208a and the spacer 220a is removed. In the case, as shown in FIG. 1L, the first portion 208a still exists between the spacers 220a.

Referring to FIG. 1L and FIG. 1M, by using the first portion 208a, the spacer 220a, and the spacer 220b as a mask, a portion of the doped polysilicon layer 106 is removed to form a polysilicon pattern 206. In one embodiment, the oxide layer 104 may be regarded as an etching stop layer in the said removal process. In the case, the top surface of the oxide layer 104 is exposed to the polysilicon pattern 206, as shown in FIG. 1M. The polysilicon pattern 206 includes a first portion 206a and a second portion 206b. The first portion 206a of the polysilicon pattern 206 is located directly under the first portion 208a of the core pattern 208 and the spacer 220a, and a width W3 of the first portion 206a may be the sum of the widths of the first portion 208a of the core pattern 208 and the spacer 220a. The second portion 206b of the polysilicon pattern 206 is located directly below the spacer 220b, and a width W4 of the second portion 206b is smaller than the width W3 of the first portion 206a.

Referring to FIG. 1M and FIG. 1N, after removing the first portion 208a of the core pattern 208, and the spacers 220a and 220b, a portion of the oxide layer 104 is removed by using the polysilicon pattern 206 as a mask, so as to form an oxide pattern 204. In the case, the oxide pattern 204 exposes a top surface of the nitride layer 102, as shown in FIG. 1N. The oxide pattern 204 includes a first portion 204a and a second portion 204b. A width W5 of the first portion 204a is greater than a width W6 of the second portion 204b. From another perspective, a layout density (or pattern density) of the second portion 204b may be greater than a layout density (or pattern density) of the first portion 204a. Therefore, the first portion 204a may be used as the layout of the peripheral circuit; and the second portion 204b may be used as the layout of the memory array. In alternative embodiments, the width W5 of the first portion 204a of the oxide pattern 204 is greater than the width W1 of the first portion 208a of the core pattern 208 (as shown in FIG. 1I); and the width W6 of the second portion 204b of the oxide pattern 204 is less than the width W2 of the second portion 208b of the core pattern 208. In other words, after the self-aligning double patterning (SADP) method of the present embodiment, the layout density (or pattern density) of the semiconductor structure can be increased or decreased to achieve a more flexible layout design.

In addition, after forming the oxide pattern 204, the underlying nitride layer 102 and target layer 100 may be patterned, thereby forming a target pattern (not shown). The said target pattern can replicate the oxide pattern 204. In the case, the layout density (or pattern density) of the target pattern may be greater or less than the layout density (or pattern density) of the core pattern 208.

In summary, in the present embodiments of the present invention, the doped polysilicon layer and the undoped polysilicon layer may be formed below and above the core layer respectively, so as to enlarge the etching selectivity between the doped polysilicon layer and the undoped polysilicon layer in the second etching process. Therefore, in the second etching process, the overlying undoped polysilicon layer may be completely removed, while the underlying doped polysilicon layer remains. In addition, in the present embodiments of the present invention, the spacer material may be formed by the ALD process, so as to obtain the spacer with a good morphology on the sidewall of the core pattern. In the case, when the spacer is used as a mask to remove the underlying target layer, the target pattern with better sidewall morphology may be formed.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A patterning method, comprising:
sequentially forming a doped polysilicon layer, a core layer, and an undoped polysilicon layer on an oxide layer;
patterning the undoped polysilicon layer to form a polysilicon pattern;
performing a first etching process by using the polysilicon pattern as a mask and the doped polysilicon layer as an etching stop layer to remove a portion of the core layer and expose a portion of the doped polysilicon layer, so as to form a core pattern, wherein performing the first etching process comprises:
performing a dry etching step to form an opening in the core layer; and
performing a wet etching step to trim the core layer, so as to enlarge the opening, so that a sidewall of the core pattern is recessed from a sidewall of the polysilicon pattern, and a width of the core pattern is smaller than a width of the polysilicon pattern directly above the core pattern;
performing a second etching process to completely remove all of the polysilicon pattern overlying the core pattern;
after completely removing all of the polysilicon pattern overlying the core pattern, performing an atomic layer deposition (ALD) process to form a spacer material on the core pattern and the doped polysilicon layer;
removing a portion of the spacer material to form a spacer on the sidewall of the core pattern; and
removing a portion of the core pattern and the doped polysilicon layer under the portion of the core pattern.

2. The patterning method according to claim 1, wherein the forming the doped polysilicon layer comprises performing an ion implantation process by using a dopant, wherein the dopant comprises $BF^{2+}$, $B^+$, $F^+$, $P^+$, or a combination thereof.

3. The patterning method according to claim 1, wherein a material of the core layer comprises low-pressure tetraethoxysilane (LPTEOS), silicon oxide, or a combination thereof.

4. The patterning method according to claim 1, wherein an etching rate of the polysilicon pattern is greater than an etching rate of the doped polysilicon layer in the second etching process.

5. The patterning method according to claim 1, wherein the second etching process comprises using an etchant comprising $NH_4OH$, tetramethylazanium hydroxide (TMAH), or a combination thereof.

6. The patterning method according to claim 1, wherein the spacer material comprises ALD silicon nitride or chemical vapor deposition (CVD) silicon nitride.

7. The patterning method according to claim 1, further comprising: removing a portion of the oxide layer to form an oxide pattern by using the spacer and the doped polysilicon layer under the spacer as a mask.

8. The patterning method according to claim 7, wherein the oxide pattern has a pattern density greater than a pattern density of the core pattern.

* * * * *